(12) United States Patent
Goncharov

(10) Patent No.: US 12,367,013 B2
(45) Date of Patent: Jul. 22, 2025

(54) TRUE RANDOM NUMBER GENERATOR

(71) Applicant: PHYSTECH TECHNOLOGIES TRUE RANDOM AG, Hünenberg (CH)

(72) Inventor: Sergey Vladimirovich Goncharov, Limassol (CY)

(73) Assignee: PHYSTECH TECHNOLOGIES TRUE RANDOM AG, Hunenberg (CH)

( * ) Notice: Subject to any disclaimer, the term of this patent is extended or adjusted under 35 U.S.C. 154(b) by 932 days.

(21) Appl. No.: 17/434,356

(22) PCT Filed: Jan. 18, 2021

(86) PCT No.: PCT/RU2021/050010
§ 371 (c)(1),
(2) Date: Aug. 26, 2021

(87) PCT Pub. No.: WO2021/162586
PCT Pub. Date: Aug. 19, 2021

(65) Prior Publication Data
US 2022/0147318 A1 May 12, 2022

(30) Foreign Application Priority Data
Jul. 17, 2020 (RU) .............. RU2020123866

(51) Int. Cl.
*G06F 7/58* (2006.01)
*H03K 3/84* (2006.01)
*H03K 19/21* (2006.01)

(52) U.S. Cl.
CPC .............. *G06F 7/588* (2013.01); *H03K 3/84* (2013.01); *H03K 19/21* (2013.01)

(58) Field of Classification Search
CPC ....................................... G06F 7/588
See application file for complete search history.

(56) References Cited

U.S. PATENT DOCUMENTS 4,691,291 A * 9/1987 Wolfram ................. G06F 7/584
708/250
7,389,316 B1 6/2008 Baetoniu
(Continued)

FOREIGN PATENT DOCUMENTS

| CN | 107943451 A | 4/2018 |
| JP | 2003173254 A | 6/2003 |

(Continued)

OTHER PUBLICATIONS

Yuanzhuo Qu et al; "Variation-Resilient True Random Number Generators Based on Multiple STT-MTJs;" IEEE Transactions on Nanotechnology, vol. 17, No. 6, Nov. 2018; pp. 1270-1281 (Year: 2018).*

(Continued)

*Primary Examiner* — Michael D. Yaary
(74) *Attorney, Agent, or Firm* — Seckel IP, PLLC

(57) ABSTRACT

The invention relates to devices for generating true random numbers, comprising a digital chaotically oscillating autonomous Boolean network as a source of entropy. According to the invention, the proposed digital chaotically oscillating autonomous Boolean network consists in three logic elements connected to each other, two of which represent two-input "Exclusive OR" and/or "Exclusive NOR" gates, and the third logic element has three inputs and one output, and implements a logic "counting ones" function, in which its output is set to a logic one if a logic one is present at no more than one of its inputs, otherwise it is set to a logic zero. The achieved technical result consists in an increase in true random number generation rate while decreasing energy consumption.

20 Claims, 7 Drawing Sheets

(56) References Cited

U.S. PATENT DOCUMENTS

| | | | |
|---|---|---|---|
| 10,613,875 B1* | 4/2020 | Lysaght | G05B 19/042 |
| 2003/0061250 A1 | 3/2003 | Fujita et al. | |
| 2004/0267845 A1* | 12/2004 | Hars | G06F 7/588 |
| | | | 708/250 |
| 2007/0143384 A1 | 6/2007 | Muranaka | |
| 2007/0244950 A1* | 10/2007 | Golic | G06F 7/584 |
| | | | 708/250 |
| 2009/0110188 A1* | 4/2009 | Dolgunov | H04L 9/0861 |
| | | | 708/250 |
| 2009/0327381 A1 | 12/2009 | Morad | |
| 2013/0022197 A1 | 1/2013 | Yamamoto et al. | |
| 2021/0334073 A1* | 10/2021 | Wang | G06F 7/588 |

FOREIGN PATENT DOCUMENTS

| | | |
|---|---|---|
| JP | 201039838 A | 2/2010 |
| RU | 2440602 C2 | 1/2012 |
| RU | 2625048 C2 | 7/2017 |
| WO | 2005078573 A1 | 8/2005 |
| WO | 2011117929 A1 | 9/2011 |
| WO | 2019222866 A1 | 11/2019 |

OTHER PUBLICATIONS

Garrett S. Rose; "A Chaos-based Arithmetic Logic Unit and Implications for Obfuscation;" 2014 IEEE Computer Society Annual Symposium on VLSI; pp. 54-58 (Year: 2014).*

Japanese Office Action dated Jul. 4, 2023 in counterpart application No. JP 2023-503177; with English machine translation (total 6 pages). (note: D5-D7 cited in the Japanese Office Action are not listed in this IDS since they were already listed in the IDS filed Aug. 26, 2021).

Extended European Search Report dated Nov. 16, 2022 in counterpart application No. EP 21753954; in English (total 3 pages). (note: WO2019222866, D1 cited in the Extended EP Search Report, is not listed in this IDS since it was already listed in the IDS filed Aug. 26, 2021).

Munoz-Pacheco et al., "Two New Asymmetric Boolean Chaos Oscillators with No Dependence on Incommensurate Time-Delays and Their Circuit Implementation", Apr. 1, 2020, https://www.mdpi.com/2073-8994/12/4/506/pdf?version=1585828373 (total 16 pages). (note: in English; D2 cited in the Extended EP Search Report).

Dong et al., "Analysis and Improvement of True Random Number Generator Based on Autonomous Boolean Network". 2017 13th International Conference on Computational Intelligence and Security (CIS), IEEE, Dec. 15, 2017, pp. 243-247. (note: in English; D3 cited in the Extended EP Search Report).

Moroccan Patent Office Search Report and written Opinion dated Mar. 3, 2023 in counterpart application No. MA 59288; with English machine translation (total 8 pages). (note: D1-D3 cited in the Moroccan Search Report are not listed in this IDS since they were already listed in the IDS filed Aug. 26, 2021).

European Patent Office Notice of Allowance dated Mar. 16, 2023 in counterpart application No. EP 21753954.3; in English (total 6 pages).

Eurasian Patent Office Notice of Allowance dated Apr. 20, 2023 in counterpart application No. ; with English machine translation (total 3 pages).

Maxim Semiconductors, "Building a Low-Cost White-Noise Generator", Application note 3469, www.maxim-ic.com/an3469, Mar. 14, 2005 (total 3 pages) (in English; cited in the Specification).

R. Zhang et al., "Boolean Chaos", Phys. Rev. E, vol. 80, p. 045202, 2009 (total 10 pages) (in English; cited in the Specification).

D. Rosin et al., "Experiments on autonomous Boolean networks", Chaos, vol. 23, pp. 025102-1 to -9, 2013 (in English; cited in the Specification).

H. L. D. de S. Cavalcante et al., "On the origin of chaos in autonomous Boolean networks", Phil. Trans. R. Soc. A, vol. 368, pp. 495-513, 2010 (in English; cited in the Specification).

D. Rosin, "Dynamics of Complex Autonomous Boolean Networks", Doctoral dissertation, Technische Universität Berlin, Berlin, Germany, 2014 (total 217 pages) (in English; cited in the Specification).

Russian Search Report dated Dec. 15, 2021 in priority application No. RU 2020123866; with English machine translation (total 4 pages) (D1-D4, WO2019222866, CN107943451, US20090327381 and U.S. Pat. No. 7,389,316 cited in the Russian Search Report are not listed in this IDS since they were already listed in the IDS filed Aug. 26, 2021).

Russian Notice of Allowance dated Dec. 19, 2020 in priority application No. RU 2020123866; with English machine translation (total 16 pages).

International Search Report and Written Opinion dated Apr. 22, 2021 in counterpart application No. PCT/RU2021/050010; w/English partial translation and partial machine translation (total 15 pages).

Indian Office Action dated Mar. 15, 2024 in counterpart application No. IN 202317007871 (total 6 pages) (note: WO2019222866, D1 cited in the Indian Office Action is not listed in this IDS since they were already listed in the IDS filed Aug. 26, 2021).

Park et al., "True random number generation using CMOS Boolean chaotic oscillator", Microelectronics Journal, vol. 46, 2015, pp. 1364-1370 (note: D2 cited in the Indian Office Action).

* cited by examiner

TRUE RANDOM NUMBER GENERATOR

FIELD OF THE INVENTION

This invention relates to devices for generating true random numbers, including a digital chaotically oscillating autonomous Boolean network as a source of entropy.

The following abbreviations are used in this description:
RNG—random number generator
PRNG—pseudo-random number generator
PLIC—programmable logic integrated circuit
ABN—autonomous Boolean network
SCO—synchronous chaotic oscillator
VLSIC—very large scale integrated circuit
ASIC—application specific integrated circuit

PRIOR ART

There are digital pseudo-random number generators (PRNG), known from the prior art, which are based on some cyclic function and include, for example, a linear congruential generator, a linear feedback shift register generator, a generalized feedback shift register generator, and a Mersenne twister. The best results are obtained by using a simple number counter connected in series with a cryptographic algorithm, such as a block cipher or a one-way hash function.

A common disadvantage of all PRNGs is the determinism of the resulting sequence, which excludes or greatly complicates the use of pseudo-random numbers for cryptographic purposes, since the entire chain of pseudo-random numbers can be predicted if the device algorithm and the initial or any previous state of such generator are known. Also, all these methods are computationally expensive, and the more requirements are imposed on the quality of random numbers, the more calculations have to be performed.

There are known true random number generators, which are based on specific physical principles. Historically, such random physical phenomena as throwing dice, radioactive decay, microphone digitization of ambient acoustic noise, atmospheric noise picked up by a radio, etc. have been used.

The disadvantage of these devices is the need for a special physical setup, sensor, or transducer, and a computer interface. In addition, the operation of such devices can be highly dependent on the environmental conditions. They require a lot of energy, and the speed of generating random numbers is often too slow.

There are known generators, which are based on physical principles, but use only electronic components. For example, the ERNIE 1 system and Ferranti Mark 1 computer used the thermal noise from a resistor. Frequently, generators utilizing an avalanche breakdown of a reverse biased p-n junction in a Zener diode are used [1].

The disadvantage of such devices is the need to manufacture a separate analog part of the device, which excludes or seriously complicates the manufacture of digital integrated circuits (VLSIC) comprising RNGs. In addition, such generators cannot be implemented in a programmable logic integrated circuit (PLIC).

There are known RNGs that use the difference in the frequency of two oscillators caused by thermal drift. For example, the Intel 82802 firmware storage chip has two oscillators, fast and slow, located in different parts of the crystal, and measures the difference between their frequencies. Such RNG can be implemented entirely by means of digital logic, since typically, inverters having feedback and a chain of buffer elements as a delay line are used as an oscillator.

The disadvantages of such generators include the need to place the oscillators far from each other in the crystal topology in order to reduce thermal correlation between them, low performance, since it is necessary to accumulate drift over some operating time period, and poor predictability of the quality of random numbers. Also, such generator is practically difficult to implement in PLIC, since the development tools do not allow controlling physical placement of the elements. As a rule, in case of an automatic placement, the oscillators, which are logically connected, will also be located in close proximity to each other, which entails a more significant frequency correlation between them.

Over the past several years, so-called "autonomous Boolean networks" (ABN) have been actively explored. Such network represents a topologically connected graph of logic elements, to which no external control or clock signals are supplied. At the same time, obvious additional requirements are imposed on such network: no element should have "hanging" (not connected to any output) inputs and no two outputs should be connected to each other. These requirements are caused by the certainty of the state of the logic elements of the network and the electrical safety of its operation. Depending on the topology, the ABN can exhibit different behaviors: be in a stable or quasi-stable state, oscillate with a certain frequency and waveform, or be in a state of so-called "Boolean chaos." An example of the simplest ABN is a repeater with an output connected to the input. Such a network is in a quasi-stable state, which means that depending on the initial state (0 or 1), it will remain in it infinitely. Another example is one or several inverters connected to each other in a ring. Depending on the number of inverters in the ring, their behavior will be stable, quasi-stable, or oscillating. One inverter will most likely be in a stable state (between 0 and 1), which is due to the physical implementation of the inverter as an amplifier with a high gain ratio and a negative feedback equal to 1. For the same reason, there may be no generation in the very small networks containing elements with a low slew rate of the output signal. With an odd number of inverters, the network will oscillate with a period proportional to the number of inverters. With an even number of inverters, the network is in a quasi-stable state. As can be seen, the random number generator implemented in the Intel 82802 integrated circuit based on two oscillators and measurement of the frequency drift between them, in fact, is a special case of the ABN. It uses two rings with a different odd number of inverters. More complex networks can often lead to chaotic behaviors.

There is a direct substantive physical analogy, which helps visually understand the behavior of the ABNs in various situations. This is a pendulum. After being deflected and released, a simple pendulum begins to oscillate with a stable period. This is an example of oscillating behavior. If we turn the pendulum upwards, then the upper point represents a quasi-stable state; any small deviation would cause the pendulum to fall to the left or to the right. If we divide the arm of the pendulum into two parts connected by a hinge, then we get a so-called chaotic pendulum, the evolution of which in time cannot be accurately predicted, since any infinitesimal change in the initial state (up to the quantum level) increases with time and leads to arbitrarily large changes in the pendulum behavior. By this analogy, it is possible to measure random deviations in the frequencies of two pendulums arising from the chaotic external effects;

however, this will require an extensive analysis. On the other hand, it is possible to deflect a chaotic pendulum and get a random value in the shortest possible amount of time.

As can be seen from the given example, oscillating ABNs can indeed be used to generate random numbers. However, ABNs, which initially exhibit chaotic behavior, are much more promising. The speed of development of Boolean chaos and its qualitative characteristics are determined by a number of factors, and the most important of all is the characteristic Lyapunov exponent. If the exponential factor is negative, the deviations fade out with time. If the exponential factor is greater than zero, the random deviations are amplified by the system. If the exponential factor is equal to zero, the deviations are not dampened or amplified, but rather accumulate if they entered the system from the outside. For fast physical generation of random numbers, the exponential factor must be non-negative. A simple pendulum has a negative factor of Lyapunov exponent, which is expressed in the fact that the oscillation frequency instantly stabilizes in the absence of external effects. A chaotic pendulum is a particular example of a system with a positive exponent, so that any small impact leads to completely different dynamics after a short time. In binary logic, there are no logical functions that would amplify small deviations, but there are functions that do not allow the resulting changes to disappear—for the case of two arguments, these are the XOR (an Exclusive "OR") and XNOR (an equivalence) functions. Any change in any input signal causes a change in the output signal. For this reason, the use of these functions is preferable in the RNGs.

From the current state of science, ABN circuits are known that demonstrate chaotic behavior. Chaos occurs when the operation of the network is determined by the smallest deviations in the supply voltage, front shifts due to thermal fluctuations, pickups and other destabilizing factors. In the literature [3], two- and three-input logic XOR or XNOR gates are considered, in which the output is brought back to the inputs through two (or, respectively, three) delay lines. In such networks, chaotic behavior can be observed at a certain ratio of the delay lines length. The problem of this network is the strong dependence of its behavior not only on the ratio of the delay lines length, but also on their physical implementation, while instead of chaos, there could be oscillations. Also, despite the apparent schematic simplicity of the device, it requires a large number of logic elements, since each delay line is a chain of inverters. As a result, a simple-looking circuit can comprise several dozen elements. Moreover, three out of four variants of such generator have a fundamental drawback, which is a loss of generation after a while. The XOR element acquires a stable state with a zero at the output regardless of the number of inputs, and the XNOR element with two inputs—with a one at the output. The XOR element with three inputs has an additional stable state—with a one at the output. As shown in reference [4], a more or less stable generation is observed in the case of a three-input XNOR element and delay lines consisting of 18, 6, and 2 inverters.

In 2009, Rui Zhang et al. [2] proposed a circuit composed of three two-input logic elements, in which Boolean chaos occurs—two XOR gates and one XNOR gate. To implement such circuit, he used discrete elements. Such circuit also has inherent disadvantages, which will be discussed below. When such a network is implemented in PLIC, the generation may disappear or oscillations may occur instead of the random behavior.

In his dissertation [4], David Rosin proposed a more complex circuit that also demonstrates a chaotic behavior—large rings of three-input XOR elements, in which each element receives as an input a signal from itself and from two nearest neighbors. In this case, the resulting signal is picked up from several points of the ring and is also combined through the XOR elements. However, in its pure form, such circuit is inoperable, since the rings consisting of an even number of elements have as many as four different stable states, and will inevitably stabilize in one of them, which are the states with all zeros, all ones, and two variants of alternating zeros and ones.

To eliminate the stable state, Rosin replaces one XOR element in the generator with an XNOR element. The quality of the resulting chaos in such generator depends on the number of logic elements in the ring. Rosin suggests using 16 elements. However, the excitation arising in such system must pass through eight logic elements before reaching the opposite side of the ring, which is time-wise comparable to one microprocessor clock cycle. Therefore, in terms of hardware implementation, it is desirable to wait for several clock cycles in order to eliminate correlation between successive values. The disadvantage of both Rosin and Zhang generators is the impossibility of a destabilizing external effect on the network.

A true random number generator is known from the prior art, which comprises a digital chaotically oscillating autonomous Boolean network as a source of entropy (see patent application specification WO2019222866 published in 2019). As with the Rosin generator, this generator uses a ring of three XOR elements and one XNOR element, and an XOR element to pick up signals from the ring. Unlike the Rosin generator, this generator uses an additional inverter to generate a high frequency periodic signal and to destabilize the autonomous Boolean network.

This device is the closest in terms of the technical substance and the achieved technical result and has been selected as a prototype of the proposed invention.

The disadvantages of this prototype also include excessive time required to generate true random numbers, a plurality of elements, and increased energy consumption.

DISCLOSURE OF THE INVENTION

Based on this original observation, the main objective of the proposed invention is to provide a true random number generator including a digital chaotically oscillating autonomous Boolean network as an entropy source, which would allow to at least mitigate a minimum of one of the above disadvantages, and specifically, increase a true random number generation rate while decreasing energy consumption, which is the task at hand.

The goal of this invention is to construct a partially controllable ABN, which would have a minimum size and ensure reaching a Boolean chaos state at the highest possible rate. The most important requirement is the impossibility of reaching a stable, quasi-stable, or oscillating state of the network. Furthermore, the rate of chaos increase directly depends on the size of the cyclic signal propagation paths present in the network. The larger the size of the path, the longer the signal must travel before returning to the starting point. Therefore, the network should be as small as possible. This becomes obvious from the consideration of an oscillator consisting of an odd number of inverters: the oscillation period is directly proportional to the length of the ring.

To perform further analysis, it is better to consider a synchronous Boolean network. The actual difference between a synchronous Boolean network and an ABN is that the signal at the outputs of all logic elements changes simultaneously, so it can be assumed that the network passes a number of states. Theoretically, at an identical operating speed of the elements, identical lengths of all conductors, and identical operating conditions of the elements, the ABN becomes a synchronous Boolean network. Moreover, as shown in reference [3], mutual influence of different network fragments can lead to their forced synchronization. This is a very important effect that must also be eliminated or minimized. Since the smallest possible network is sought, such networks can be analyzed in the order of increasing number of logic elements. Since a number of possible logical functions and networks based thereon are countable and ordered, a comprehensive analysis can be carried out.

A single-element network can consist of one repeater or one inverter. In the former case, there is no generation, and in the latter case, there are periodic oscillations. Therefore, a network consisting of one logic element cannot generate chaos.

We will now consider a network with two elements. Each element can comprise no more than two inputs, and a total of four different network states are possible. There are many possible combinations of transitions between these states, but they can be grouped by properties. The first category is when there is one degenerate state, in which the network can exist indefinitely. Such networks are obviously unusable. The second category is when there is at least one cycle consisting of two or three states. In this case, one element is in a stable state, and the second element oscillates, or both elements oscillate with the same period. Such networks are also unusable. The last possible case is when the network evolves through all four states. In this case, the total number of different cycles is equal to 3!=6. Sorting through all variants shows that in this case, one element oscillates with a period of T, and the other—with a period of 2T, or both elements oscillate with the same period of 2T. Therefore, a two-element network cannot be a reliable source of chaos.

Therefore, to ensure chaotic behavior, a network consisting of at least three elements is required. In a generalized case, these should be two- or three-input elements, since the presence of a single-input element turns the network into a network with two elements. Accordingly, at any given time the network can be in one of eight different states. The Zhang generator is exactly a three-element network. However, according to the results of analysis of the state change graph of the Zhang generator, regardless of the initial state, such generator enters a cycle of four states, in which one element oscillates with a period of T, and the other two elements—with a period of 2T. Of course, this fact does not exclude reaching chaos, but it indicates the network's sensitivity to implementation and cross-impact of the elements with respect to each other.

To search for the required network, we can immediately discard all networks having a stable state. Also, we can immediately exclude all networks in which the cycle has less than eight states, since such networks allow for oscillations and cross-impact. The only remaining networks are those that evolve through all eight states. A total number of possible cycles is 7!=5040, starting with state 000, passing through all possible states, and returning to state 000 after eight iterations.

For further consideration, it is necessary to introduce the concept of autocorrelation of the output signal of a logic element. During the network evolution, the output of each element cycles through eight states, which can be denoted using eight-digit binary numbers, such as 01010101b. To calculate autocorrelation, we will shift this number seven times in a cycle by one bit (by transferring the low-order bit to the high-order position), while counting each time the number of bit matches with the original value in the corresponding positions. If, upon comparison, we find that all eight positions are different, then such a signal correlates just as well as when all eight positions match. The minimum correlation will be the case with four matches and four differences. The total correlation is defined as the sum of seven absolute values of the difference between the number of matches and 4, divided in half, since such a sum is always even.

For some sequences, a zero autocorrelation is indeed possible. However, in such sequences, the number of zeros and ones is different, and in the case of a network passing through a full cycle of all eight states, each element must have the same number of states with ones and with zeros at the output. Among all such sequences, the minimum possible autocorrelation is equal to two. In total, there are only four fundamental sequences with such autocorrelation: 00010111b, 00011011b, 00100111b, and 00101011b. All other sequences with the lowest possible autocorrelation are their derivatives obtained by cyclic shift and inversion.

For a network of three elements, the minimum theoretically possible total autocorrelation is 6, and the maximum is 26. A three-bit binary counter has an autocorrelation of 18, and when the corresponding ABN is implemented, a chaotic behavior never occurs in such network.

There are 648 topologically different networks in total, passing through a full cycle of all eight states. Among them, 216 networks have the minimum possible total autocorrelation of 6. From these networks, it is necessary to discard those in which the output signals of two different elements correlate with each other. In such networks, it is theoretically possible to perform a phase adjustment of the element operation, which will lead to signal ordering. There are even such networks, in which signals on all three elements correlate with each other. Such networks are especially dangerous. Among the selected networks, only 80 have no correlation between the signals of the elements. Since we are looking for the smallest possible network, we will give preference to networks having two-input elements. There are only 24 such networks.

There is one more important circumstance in favor of two-input elements. All generators considered earlier are uncontrollable in the sense that no external destabilizing signal can be connected to them in order to force the occurrence of chaos and allow the networks to cascade with each other. Adding an additional input should transform one network into another, which also fully satisfies the specified criteria. This is most easily accomplished by adding a third input to the two-input elements. Since two-input elements can only be XOR or XNOR gates, adding a new input is only possible by obtaining three-input XOR and XNOR gates. In this case, when a logic one is supplied to the third input, the two-input XOR and XNOR gates undergo mutual transformation.

It turns out that of the twenty-four remaining networks, only eight can be reconfigured in such a way with a change in the nature of generation and preservation of all basic characteristics. Moreover, these networks also have a record low level of complexity—each such network has two two-input elements. All of these eight networks are grouped in pairs into four reconfigurable networks, each of which consists of three three-input logic elements. Each reconfigurable network corresponds to two original networks. These four networks are functionally completely equivalent, but among them one network has a unique property—all of its logic elements are symmetric with respect to the assigned inputs (the inputs of the elements are equivalent), which simplifies the implementation of the network and allows to avoid errors.

These four Boolean networks are the substance of the invention. They satisfy all the requirements listed above and have an additional modulation property. They all consist of three logic elements—two 3-XOR or 3-XNOR gates, and one three-input output gate with a more complex special function called "counting ones." These four networks are absolutely identical in the way the elements are connected to each other, and differ only by the type of elements used. They are combined into two groups: "A" and "B." Group "A" uses the same elements, both being 3-XOR or 3-XNOR gates. Group "B" uses different elements—one 3-XOR and the other 3-XNOR. The logical diagram of all these networks is shown in the drawings attached below.

The "counting ones" element can be described as follows: the output of the element is set to 1 if no more than one input is 1, otherwise the output is 0. Thus, if the three inputs are zero, then the output is also a logic one (see Table 1).

TABLE 1

Truth table of the third logic element ("counting ones").

| Input 3 | Input 2 | Input 1 | Output |
|---------|---------|---------|--------|
| 0 | 0 | 0 | 1 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

Depending on the network version, one or two inputs of this element can be inverted. Signals from all three logic elements are fed to the input of the "counting ones" element. The two inputs of the first XOR/XNOR gate receive a signal from the same gate and from another XOR/XNOR gate. The two inputs of the second XOR/XNOR gate receive a signal from the first XOR/XNOR gate and from the output of the "counting ones" element. The remaining free inputs of both XOR/XNOR gates are combined together and represent the modulation input of the Boolean network.

Each of the described Boolean networks is the basic block used to build a random number generator. We will call this basic block a "chaotic oscillator." It has an output and a modulation input. The chaotic oscillator cannot modulate itself. It is easy to verify that with such modulation, the chaotic oscillator degenerates either into an ordinary oscillator or into a stable level source. Also, it is not recommended to leave the chaotic oscillator without modulation at all, since, due to the specifics of the physical implementation, the behavior of two oscillators without modulation can be very different. It is desirable to use a block of oscillators that modulate each other, and it is desirable that a loop formed by the modulation is as large as possible to reduce cross-correlation of the oscillators.

In theory, the signal from an unmodulated oscillator can be picked up from any of the three logic elements. However, to reduce cross-correlation of the signal from different oscillators, the chaotic signal must be picked up from the "counting ones" element.

An autonomous Boolean network is always in a state of chaotic oscillation, which requires energy. To stop the generation, the network should be modified in such a way that regardless of the initial state, it would be guaranteed to reach the only possible deterministic state. For the above networks, this cannot be achieved by turning off just one logic element. At least two elements must be turned off, and in the best case, those would be the same XOR or XNOR input elements. The network can be turned off by forcing the outputs of these elements to switch to 0 or 1. In this case, if the outputs of the XOR/XNOR elements are set to 0, then the output of the network will be 1, and vice versa.

The chaotic oscillator itself cannot be used as a random number generator, since it only has an asynchronous output, which has a broadband chaotic analog signal. Each chaotic oscillator, regardless of its internal structure, must be placed in a synchronous "wrapper" that performs two functions at once. On the one hand, it provides a stable output logic signal, and on the other hand, it stores the previous state, which, if desired, can be used via modulation inputs as a "seed" to obtain the next random number. The designation and internal diagram of such synchronous chaotic oscillator (SCO) are shown in the drawings below.

The SCO has clock and modulation inputs and two outputs: synchronous (used to obtain a random number) and asynchronous (required in order to modulate other SCOs). Along each front of the clock signal, a D-trigger captures the value of the asynchronous signal. The obtained value is fed to the synchronous output or, on the other hand, can be used for modulation together with an external signal using a two-input XOR gate. The random number generator is based on such SCO blocks.

Despite mutual modulation, the SCO blocks can have a bias in the distribution between the number of zeros and ones at the output, i.e., it is more likely for one type of value to appear at the output than another. This is also due to the specifics of physical operation of the logic elements of the circuit. To eliminate this bias, a procedure of so-called "whitening" of the obtained random numbers may be required.

Thus, the substance of the invention is that a digital chaotically oscillating autonomous Boolean network includes three logic elements connected to each other, two of which are the two-input "Exclusive OR" and/or "Exclusive NOR" gates, and the third logic element has three inputs and one output, and implements a special logical function "counting ones," in which its output is set to a logic one if a logic one is present at no more than one of its inputs, otherwise it is set to a logic zero.

Due to these favorable characteristics, it becomes possible to obtain true random numbers over a very short period of time using a generator consisting of only three elements.

There is a preferred embodiment of the device, in which the output of the first two-input logic element is connected to the first input of the second two-input logic element and to the second input of the third logic "counting ones" element, the output of the second two-input logic element is connected to its second input, to the second input of the first two-input logic element, and to the third input of the third logic "counting ones" element, and the output of the third logic "counting ones" element is connected to its first input, to the first input of the first two-input logic element, and to the output of the entire network.

Due to these favorable characteristics, it becomes possible to guarantee the chaotic behavior of the autonomous Boolean network, which is the base of true random number generator.

There is another embodiment of the device, in which the second and/or third inputs of the third logic "counting ones" element are inverted.

Due to these favorable characteristics, it becomes possible to provide specific implementation of the true random number generator.

There is yet another embodiment of the device, in which both two-input "Exclusive OR" and/or "Exclusive NOR" gates have additional third logic inputs, which are combined together and connected to an additional external modulation input of a digital chaotically oscillating autonomous Boolean network.

Due to these favorable characteristics, it becomes possible to improve the statistical properties of the true random number generator.

In addition, there is an embodiment of the device, in which the generator has a shutdown input, while both "Exclusive OR" and/or "Exclusive NOR" gates have additional shutdown inputs with the possibility of forcibly switching the outputs of both said gates to the state of a logic zero or a logic one regardless of the state of other inputs, said inputs being combined together and connected to the specified generator shutdown input.

Due to these favorable characteristics, it becomes possible to turn the true random number generator on and off.

There is yet another embodiment of the device, in which the digital chaotically oscillating autonomous Boolean network is combined with a D-trigger into a synchronous chaotic oscillator block having a clock input connected to the clock input of the D-trigger, a modulation input connected to the modulation input of the autonomous Boolean network, an asynchronous output connected to the output of the autonomous Boolean network, and a synchronous output connected to the output of the D-trigger, while the output of the autonomous Boolean network is connected to the data input of the D-trigger.

Due to these favorable characteristics, it becomes possible to connect the true random number generator to external clocked circuits.

In addition, there is an embodiment of the device, which comprises an additional two-input "Exclusive OR" and/or "Exclusive NOR" element, the first input of which is connected to the external modulation input, the second input is connected to the D-trigger output, and the output is connected to the modulation input of the autonomous Boolean network.

Due to these favorable characteristics, it becomes possible to improve the statistical properties of the true random number generator by changing its initial state.

Finally, there is an embodiment of the device, which comprises a set of N blocks of synchronous chaotic oscillators combined into a ring structure, the clock inputs of which are combined together and connected to a common clock signal, and their synchronous outputs are connected to an N-bit output of the generator, and a set of N additional two-input "Exclusive OR" and/or "Exclusive NOR" gates so that the output of each such gate is connected to the modulation input of the corresponding block of the synchronous chaotic oscillator, its first input is connected to the asynchronous output of the previous synchronous chaotic oscillator block in the chain, and the second input is connected to the asynchronous output of the subsequent synchronous chaotic oscillator block in the chain.

Due to these favorable characteristics, it becomes possible to generate multi-bit true random numbers.

The combination of substantial features of the proposed invention is unknown from the prior art with respect to the methods having a similar purpose, which makes it possible to conclude that the novelty criterion of the invention in relation to the method is met. In addition, this solution is not obvious to a person skilled in the art.

BRIEF DESCRIPTION OF THE DRAWINGS

Other distinctive features and advantages of this invention clearly follow from the description provided below for illustration purposes, without limitations, using the references to the accompanying drawings, in which.

Figure 1:
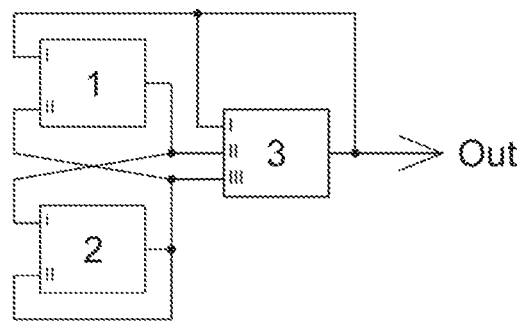
FIG. 1 shows a functional diagram of the autonomous Boolean network according to the invention.
Figure 2:
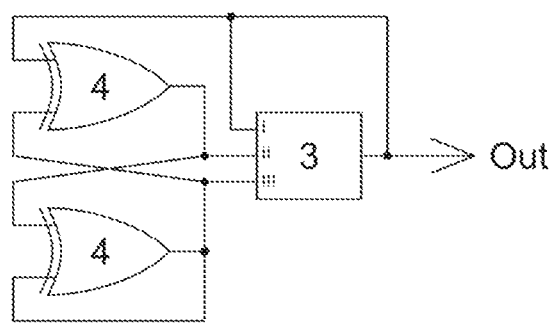
FIG. 2 shows a logical structure of the autonomous Boolean network using XOR elements according to the invention.
Figure 3:
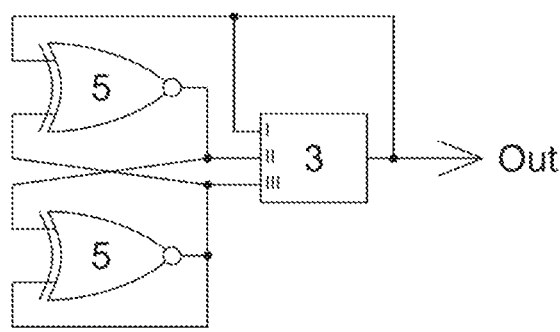
FIG. 3 shows a logical structure of the autonomous Boolean network using XNOR elements according to the invention.
Figure 4:
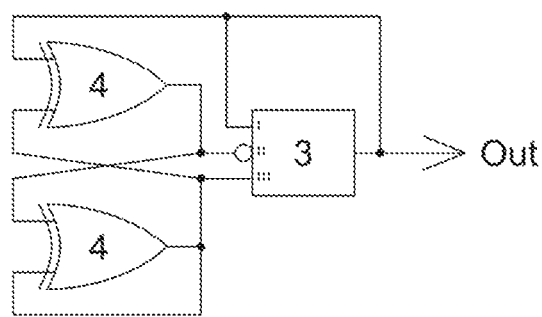
FIG. 4 shows a logical structure of the autonomous Boolean network using XOR elements and input inversion of the "counting ones" element according to the invention.
Figure 5:
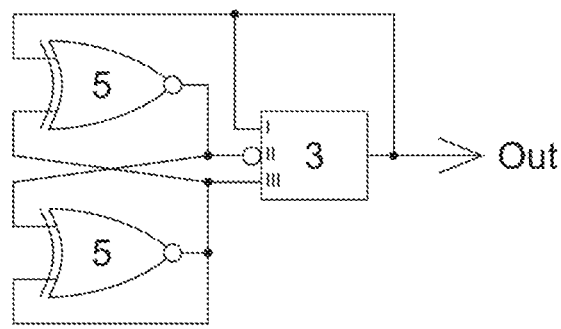
FIG. 5 shows a logical structure of the autonomous Boolean network using XNOR elements and input inversion of the "counting ones' element according to the invention.
Figure 6:
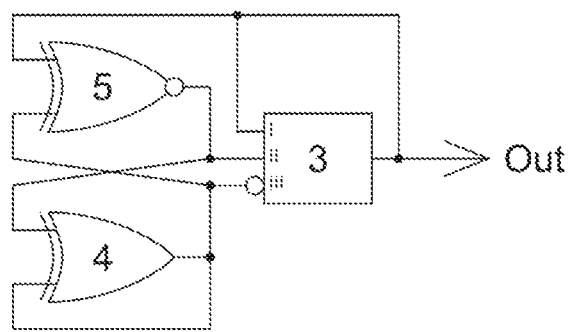
FIG. 6 shows a logical structure of the autonomous Boolean network using XOR and XNOR elements according to the invention.
Figure 7:
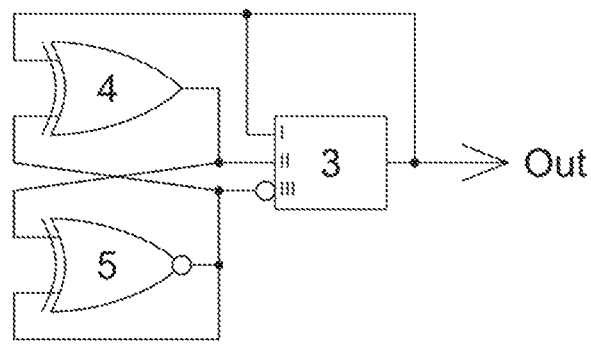
FIG. 7 shows a logical structure of the autonomous Boolean network using XNOR and XOR elements according to the invention.
Figure 8:
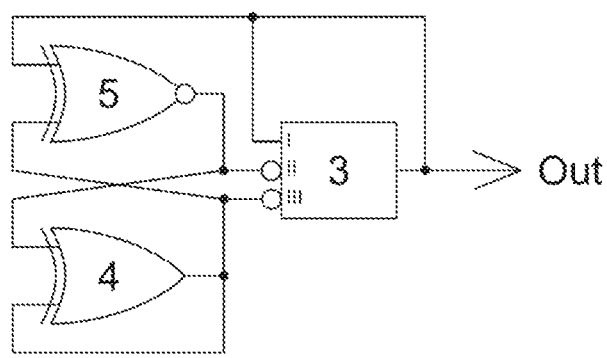
FIG. 8 shows a logical structure of the autonomous Boolean network using XOR and XNOR elements and input inversion of the "counting ones" element according to the invention.
Figure 9:
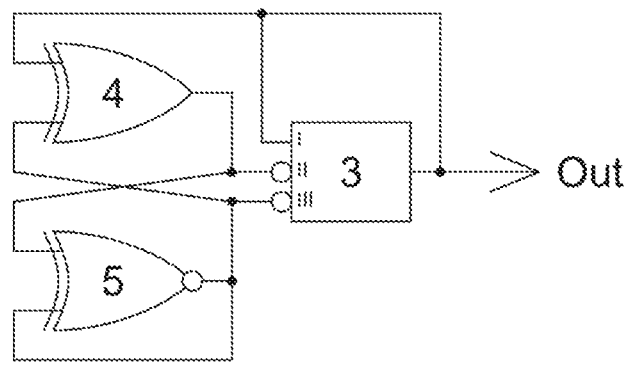
FIG. 9 shows a logical structure of the autonomous Boolean network using XNOR and XOR elements and input inversion of the "counting ones" element according to the invention.

Indications on the drawings are as follows:
1—first logic element;
2—second logic element;
3—third logic element;
4—XOR gate;
5—XNOR gate;
6—synchronous chaotic oscillator;
7—chaotic oscillator;
8—D-trigger;
Modulation—modulation input;
Enable—enabled generation input;
Out—output;
Sync out—synchronous output;

Async out—asynchronous output;
Clock—clock signal.

According to FIGS. 1-15, a true random number generator comprising a digital chaotically oscillating autonomous Boolean network as an entropy source includes the following. A digital chaotically oscillating autonomous Boolean network includes three logic elements: 1—first, 2—second, and 3—third, connected to each other, two of which (1 and 2) represent two-input "Exclusive OR" and/or "Exclusive NOR" gates, and the third logic element (3) has three inputs (inputs of all logic elements are designated by Roman numerals I, II, and III) and one output.

Logic element 3 implements a special logic "counting ones" function, in which its output is set to a logic one if a logic one is present at no more than one of its inputs, otherwise it is set to a logic zero.

The output of the first two-input logic element 1 is preferably connected to the first input of the second two-input logic element 2 and to the second input of the third logic "counting ones" element 3. The output of the second two-input logic element 2 is connected to its second input, to the second input of the first two-input logic element 1, and to the third input of the third logic "counting ones" element 3. The output of the third logic "counting ones" element 3 is connected to its first input, to the first input of the first two-input logic element 1, and to the output of the entire network.

The second and/or third inputs of the third logic "counting ones" element 3 can be inverted.

Figure 10:
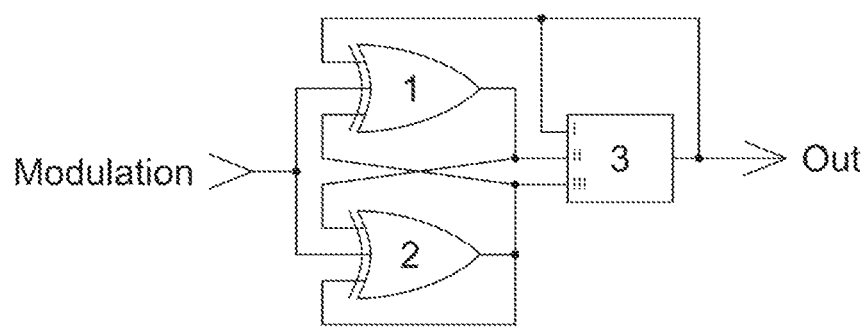
FIG. 10 shows a logical structure of the autonomous Boolean network having a modulation input according to the invention.

In a particular embodiment of the invention, both two-input gates 1 and 2 ("Exclusive OR" and/or "Exclusive NOR") have additional third logic inputs, which are combined together and connected to an additional external modulation input of a digital chaotically oscillating autonomous Boolean network (see FIG. 10).

Figure 11:
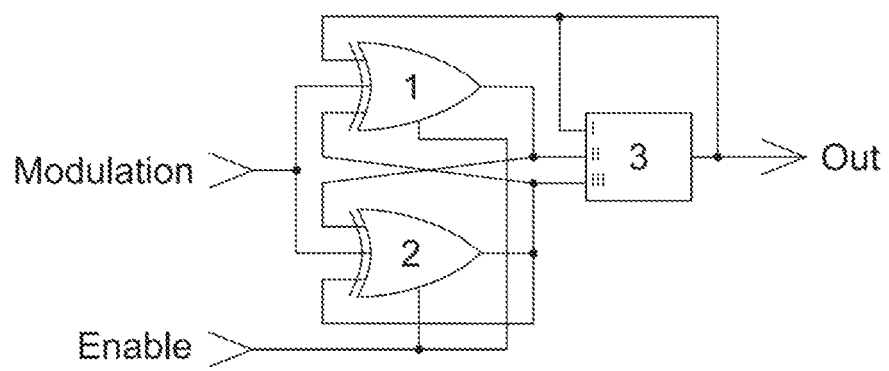
FIG. 11 shows a logical structure of the autonomous Boolean network having a modulation input and enabled generation according to the invention.

In a particular embodiment of the invention, the generator has a shutdown input, and both "Exclusive OR" and/or "Exclusive NOR" gates have additional shutdown inputs with the possibility of forcibly switching the output of both said gates to the state of logic zero or logic one regardless of the state of other inputs, these inputs being combined together and connected to the specified generator shutdown input (see FIG. 11).

Figure 12:
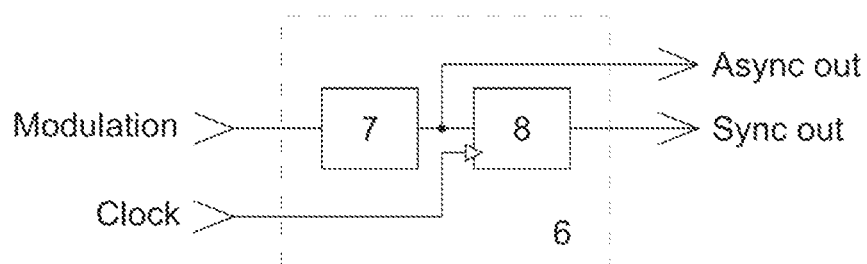
FIG. 12 shows the layout of the synchronous chaotic oscillator based on the described Boolean networks according to the invention.
Figure 13:
FIG. 13 shows the designation of the synchronous chaotic oscillator according to the invention.

In particular, a digital chaotically oscillating autonomous Boolean network can be combined with a D-trigger into a synchronous chaotic oscillator block having a clock input connected to the clock input of the D-trigger, a modulation input connected to the modulation input of the autonomous Boolean network, an asynchronous output connected to the output of the autonomous Boolean network, and a synchronous output connected to the output of the D-trigger, while the output of the autonomous Boolean network is connected to the data input of the D-trigger (see FIGS. 12-13).

Figure 14:
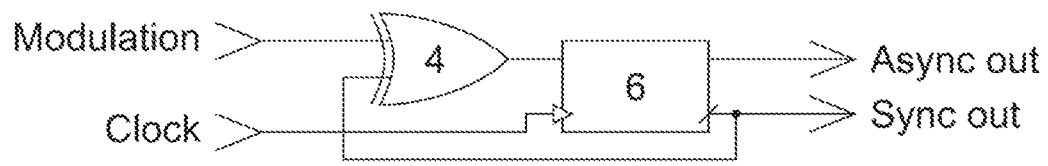
FIG. 14 shows a variant of the synchronous chaotic oscillator using the previous value as a seed according to the invention.

In a particular embodiment of the invention, the generator includes an additional two-input "Exclusive OR" and/or "Exclusive NOR" gate, the first input of which is connected to the external modulation input, the second input is connected to the output of the D-trigger, and the output is connected to the modulation input of the autonomous Boolean network (see FIG. 14).

Figure 15:
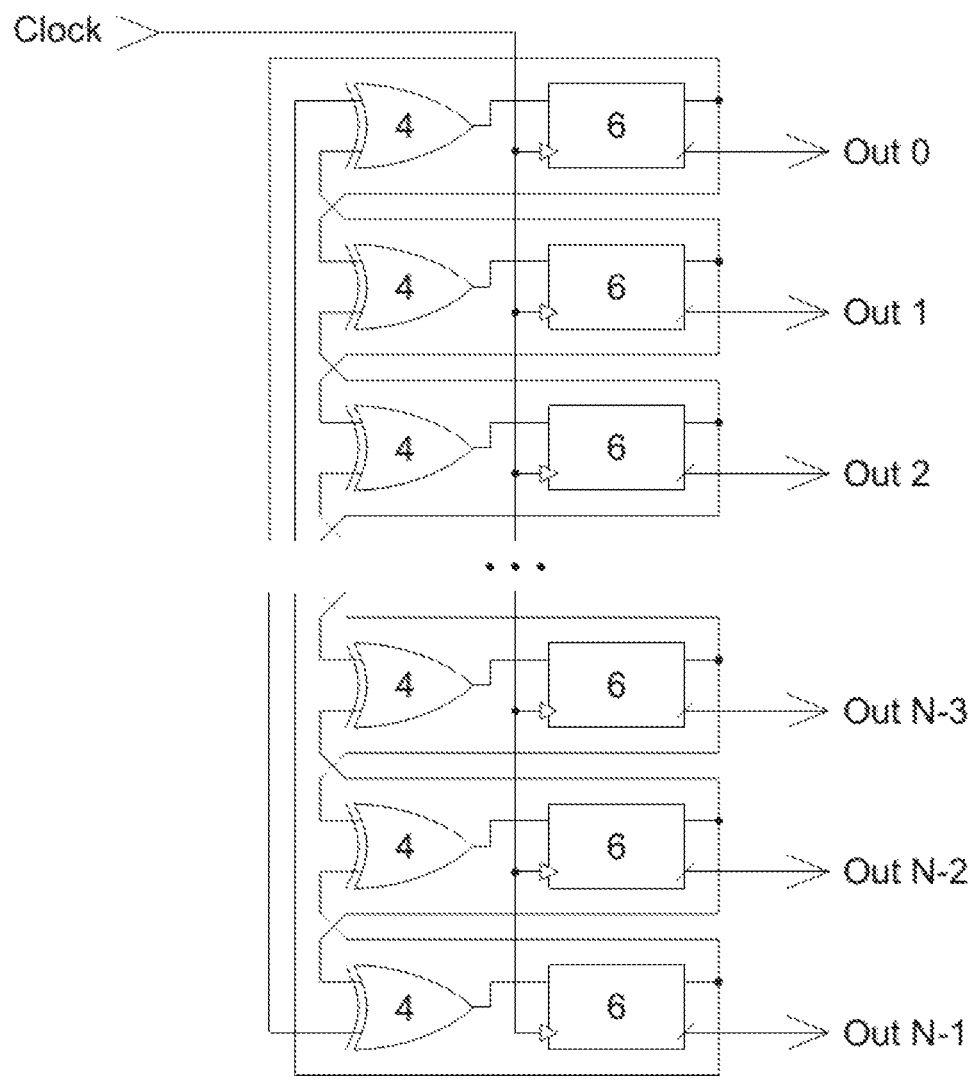
FIG. 15 shows a diagram of the random number generator based on a synchronous chaotic oscillator according to the invention.

In a particular embodiment, the invention includes a plurality of N blocks of synchronous chaotic oscillators combined into a ring structure, the clock inputs of which are combined together and connected to a common clock signal, and their synchronous outputs are connected to the N-bit output of the generator, and a plurality of N additional two-input "Exclusive OR" and/or "Exclusive NOR" gates so that the output of each such gate is connected to the modulation input of the corresponding block of the synchronous chaotic oscillator, its first input is connected to the asynchronous output of the previous synchronous chaotic oscillator block in the chain, and the second input is connected to the asynchronous output of the subsequent synchronous chaotic oscillator block in the chain (see FIG. 15).

Implementation of the Invention

The true random number generator operates as follows. We will provide the most comprehensive example of the implementation of the invention with the realization that this example does not limit the application of the invention.

A digital chaotically oscillating autonomous Boolean network is formed from three logic elements connected to each other, two of which represent two-input "Exclusive OR" and/or "Exclusive NOR" gates, and the third logic element is used to implement a special logical "counting ones" function, in which its output is set to a logic one if a logic one is present at no more than one of its inputs, otherwise it is set to a logic zero.

A synchronous chaotic oscillator (SCO) is formed, which has clock and modulation inputs and two outputs—a synchronous output used to obtain a random number and an asynchronous output required for modulation of other SCOs. Along each front of the clock signal, a D-trigger captures the value of the asynchronous signal. The obtained value is fed to the synchronous output and, on the other hand, is used for conditional inversion of the input modulation signal using a two-input XOR gate.

The random number generator is built on such SCO blocks.

A multi-bit true random number generator is built according to a circuit, in which a ring of SCO blocks is used, modulated in opposite directions. The modulation input of each SCO block receives a signal from the "Exclusive OR" gate, the inputs of which are connected to the asynchronous outputs of the previous and subsequent SCO blocks in the ring.

INDUSTRIAL APPLICABILITY

The proposed true random number generator can be practically realized by those skilled in the art and, once implemented, will provide the realization of the declared purpose, which makes it possible to conclude that the industrial applicability criterion of the invention is met.

In accordance with the proposed invention, a prototype of a true random number generator was produced. During the study, both the already mentioned Zhang and Rosin generators as well as the generator based on the described Boolean network were experimentally tested in the PLIC. The random nature of the numbers of the proposed generator is confirmed by the following experiment, which was carried out using the following PLIC: Altera Cyclone IV EP4CE22F17C6N. The network is in a "reset" state, i.e., the outputs of all logic elements are set to a predefined state of "zero". Then, in one clock cycle, the reset signal is removed, and in the next clock cycle, the state of the output of the chaotic oscillator is captured. The data obtained during multiple network restarts passed the randomness test and did not show significant correlation with each other at a clock frequency of up to 150 megahertz, which indicates the onset of chaos in less than 7 nanoseconds. After the whitening procedure, the resulting random numbers passed the NIST randomness tests.

Thus, testing of the prototype of a true random number generator has shown that the declared technical result is achieved (namely, an increase in the true random number generation rate while decreasing energy consumption) due to the fact that a digital chaotically oscillating autonomous Boolean network includes three logic elements connected to each other, two of which represent two-input "Exclusive OR" and/or "Exclusive NOR" gates, and the third logic element has three inputs and one output, and implements a special logical "counting ones" function, in which a logic one is set at its output if a logic one is present at no more than one of its inputs, otherwise a logic zero is set.

In addition, the technical result of the invention is a set of the only possible networks of logic elements, each of which has the following properties:

1. It has no stable states and short cycles, which would cause ordering of the network operation and disappearance of Boolean chaos.

2. Output signals of all elements have the lowest theoretically possible autocorrelation, which forces the network to fall into a chaotic behavior.

3. There is no correlation of the shape of the output signals of all elements, which excludes cross-phase modulation of the elements during network operation.

4. It has the smallest possible size, which provides the fastest possible chaos build-up rate due to short propagation loops within the network.

5. It has an external modulation input that allows destabilizing the network (thus, preventing physical equilibrium) and combining networks into scalable clusters using cross-modulation.

In addition, only one network from this set uses the logic elements, which are input-symmetrical.

Thus, such networks enable creation of a random number generator with the following unique characteristics:

1. The resulting numbers are truly random, which allows using them for cryptographic purposes.

2. The random number generation rate is so high that the behavior of the network is unpredictable even during the propagation of the signal through several logic elements. Thus, when implemented in microprocessor systems, a random number can be obtained in one clock cycle. Such generation rate virtually satisfies any possible need.

3. The modulation input allows to further improve the characteristics, since it can be fed with another random number (a so-called "seed" of the proposed random number generator). This forces the network to start from a new state each time.

4. The same input allows for cross-modulation of bits of the proposed generator, thereby increasing the chaos onset rate.

5. The minimum network size makes the proposed generator the most economical in terms of energy consumption.

6. The proposed generator can be implemented with equal efficiency on both discrete elements and in PLICs or ASICs.

7. The design of the proposed generator is simple and the costs of its implementation are negligible, which makes it possible to use it everywhere, including low-cost and energy-saving devices.

LITERATURE

[1] Maxim Semiconductors. Building a Low-Cost White-Noise Generator. Application note 3469.
[2] R. Zhang, H. L. D. de S. Cavalcante, Z. Gao, D. J. Gauthier, J. E. S. Socolar, M. M. Adams, and D. P. Lathrop. Boolean Chaos. Phys. Rev. E 80, 045202 (2009).
[3] David P. Rosin, Damien Rontani, Daniel J. Gauthier, and Eckehard Schöll. Experiments on autonomous Boolean networks. Chaos 23, 025102 (2013).
[4] Hugo L. D. de S. Cavalcante, Daniel J. Gauthier, Joshua E. S. Socolar and Rui Zhang. On the origin of chaos in autonomous Boolean networks. Phil. Trans. R. Soc. A 368, 495-513 (2010).
[5] David Rosin, Dynamics of Complex Autonomous Boolean Networks. Doctoral dissertation. Technische Universität Berlin.

The invention claimed is:

1. A true random number generator comprising an autonomous Boolean network comprising first, second and third logic elements connected to each other, wherein:
the first logic element comprises two logic inputs and is an "Exclusive OR" or "Exclusive NOR" gate;
the second logic element comprises two logic inputs and is an "Exclusive OR" or "Exclusive NOR" gate;
the third logic element comprises three logic inputs, wherein
the output of the third logic element is set to a logic "one" if and only if a logic "one" is present at not more than one of the inputs of the third logic element, otherwise the output of the third logic element is set to a logic "zero";
the output of the first logic element is connected to a first input of the second logic element and to a second input of the third logic element;
the output of the second logic element is connected to a second input of the second logic element, to a second input of the first logic element, and to a third input of the third logic element; and
the output of the third logic element is connected to a first input of the third logic element, to a first input of the first logic element, and to an output of the autonomous Boolean network.

2. The generator according to claim 1, wherein the second input, the third input, or both the second and third inputs of the third logic element is or are inverted.

3. The generator according to claim 1, further comprising a modulation input, wherein both the first "Exclusive OR" or "Exclusive NOR" gate and the second "Exclusive OR" or "Exclusive NOR" gate have additional third logic inputs, which are combined together and connected to the modulation input.

4. The generator according to claim 1, further comprising a shutdown input, wherein both the first "Exclusive OR" or "Exclusive NOR" gate and the second "Exclusive OR" or "Exclusive NOR" gate have additional shutdown inputs capable of switching outputs of both gates either to a logic "zero" or to a logic "one" state regardless of a state of all other inputs of the first and second gates, and wherein the additional shutdown inputs are all connected to the specified generator shutdown input.

5. The generator according to claim 3, further comprising a D-trigger that is combined with the autonomous Boolean network into a synchronous chaotic oscillator block having a clock signal connected to a clock input of the D-trigger, a modulation signal connected to a modulation input of the autonomous Boolean network, an asynchronous output connected to the output of the autonomous Boolean network, and a synchronous output connected to an output of the D-trigger, the output of the autonomous Boolean network being connected to a data input of the D-trigger.

6. The generator according to claim 5, further comprising an external modulation input and an additional logic gate, wherein:

the additional logic gate comprises two logic inputs and is an "Exclusive OR" or "Exclusive NOR" gate;

a first input of the additional logic gate is connected to the external modulation signal;

a second input of the additional logic gate is connected to the output of the D-trigger; and the output of the additional logic gate is connected to the modulation input of the autonomous Boolean network.

7. The generator according to claim 5, further comprising a plurality of N synchronous chaotic oscillator blocks, of which the synchronous chaotic oscillator block is one, combined into a chain forming a ring structure, clock inputs of the synchronous chaotic oscillator blocks being combined together and connected to a common clock signal, and synchronous outputs of the synchronous chaotic oscillator blocks being connected to an N-bit output of the generator, and N additional "Exclusive OR" or "Exclusive NOR" gates each having two inputs, so that an output of each of the N additional "Exclusive OR" or "Exclusive NOR" gates is connected to a modulation input of a corresponding one of the N synchronous chaotic oscillator blocks, a first input of the N additional "Exclusive OR" or "Exclusive NOR" gates being connected to an asynchronous output of a previous synchronous chaotic oscillator block in the chain, and a second input of the N additional "Exclusive OR" or "Exclusive NOR" gates being connected to an asynchronous output of a subsequent synchronous chaotic oscillator block in the chain.

8. A method of generating a random value comprising:
causing a transmission of a signal in a circuit comprising first, second, and third logic elements to generate chaotic oscillations, wherein:
the first logic element comprises two logic inputs that receive a signal from the output of the second logic element and a signal from the output of the third logic element,
the second logic element comprises two logic inputs that receive a signal from the output of the first logic element and a signal from the output of the second logic element,
each of the first logic element and the second logic element implements either "Exclusive OR" or "Exclusive NOR" logic function,
the third logic element comprises three logic inputs that receive a signal from the output of the first logic element, a signal from the output of the second logic element, and a signal from the output of the third logic element, and
the third logic element sets a logical value "True" in the output if and only if not more than one logical value "True" is present on all of its inputs, otherwise it sets a logical value "False" in the output; and
causing a capture of a random value from the output of the third logic element.

9. The method of claim 8, wherein at least one of the two signals that are received by the third logic element from the output of the first logic element and from the output of the second logic element is inverted.

10. The method of claim 8, further comprising causing a transmission of a modulation signal to the circuit, wherein:
the first logic element comprises an additional logic input that receives the modulation signal; and
the second logic element comprises an additional logic input that receives the modulation signal.

11. The method of claim 8, further comprising causing a transmission of a shutdown signal to the circuit, wherein:
the first logic element comprises an additional input that receives the shutdown signal to switch the output of the first logic element either to the logic "True" state or to the logic "False" state regardless of state of all other inputs of the first logic element; and
the second logic element comprises an additional input that receives the shutdown signal to switch the output of the second logic element either to the logic "True" state or to the logic "False" state regardless of state of other inputs of the second logic element.

12. The method of claim 10, wherein generating the random number comprises:
causing a transmission of a clock signal to the circuit; and
causing a sampling of a random value from the output of an additional D-trigger, wherein:
a data input of the D-trigger receives a signal from the output of the third logic element; and
a clock input of the D-trigger receives the clock signal.

13. The method of claim 12, further comprising causing a transmission of an external modulation signal to the circuit, wherein:
an additional logic element transmits its output signal to the modulation signal of the circuit;
the additional logic element comprises two inputs and implements either "Exclusive OR" or "Exclusive NOR" logic function; and
the additional logic element receives the signal from the output of the D-trigger, and the external modulation signal on its inputs.

14. The method of claim 12, further comprising causing a transmission of a signal in a circular chain of pluralities of duplicates of the circuit each connected to a respective duplicate of the additional logic element, by a transmission of signal from the output of the respective additional logic element to the modulation input of each respective duplicate of the circuit, wherein:
each of the additional logic elements comprises two inputs and implements either "Exclusive OR" or "Exclusive NOR" logic function; and
each of the respective additional logic elements receives signal (a) from the output of the third logic element of a previous duplicate of the circuit in chain, and (b) from the output of the third logic element of a subsequent duplicate of the circuit in chain.

15. A method of manufacturing of a random number generator, comprising implementing a circuit comprising first, second, and third logic elements, wherein:
the first logic element comprises two inputs and implements either "Exclusive OR" or "Exclusive NOR" logic function;
the second logic element comprises two inputs and implements either "Exclusive OR" or "Exclusive NOR" logic function;
the third logic element comprises three inputs and provides a logical "True" value in the output if and only if not more than one of its inputs is in logical "True" state, otherwise the third logic element provides a logical "False" value in the output;
the inputs of the first logic element are connected to the output of the second logic element and to the output of the third logic element;
the inputs of the second logic element are connected to the output of the first logic element and the output of the second logic element;

the inputs of the third logic element are connected to the output of the first logic element, to the output of the second logic element, and to the output of the third logic element; and the output of the third logic element is connected to an external circuit that captures random values produced by the random number generator.

16. The method of claim 15, wherein at least one of the inputs of the third logic element that are connected to the output of the first logic element and to the output of the second logic element is inverted.

17. The method of claim 15, further comprising implementing a modulation signal, wherein:

the first logic element comprises an additional logic input that is connected to the modulation signal; and the second logic element comprises an additional logic input that is connected to the modulation signal.

18. The method of claim 15, further comprising implementing a shutdown signal input, wherein:

the first logic element comprises an additional input that is connected to the shutdown signal input to switch the output of the first logic element either to the logic "True" state or to the logic "False" state regardless of a state of all other inputs of the first logic element; and the second logic element comprises an additional input that is connected to the shutdown signal input to switch the output of the second logic element to the logic "True" state or to the logic "False" state regardless of a state of all other inputs of the second logic element.

19. The method of claim 17, further comprising implementing a D-trigger and a clock signal, wherein:

the data input of the D-trigger is connected to the output of the third logic element;

the clock input of the D-trigger is connected to the clock signal; and the output of the D-trigger is adapted for connection to an external circuit that further processes or consumes random bits.

20. The method of claim 19, further comprising implementing a circular chain of pluralities of duplicates of the circuit each connected to a respective duplicate of an additional logic element, wherein:

each the respective additional logic element comprises two inputs and implements either "Exclusive OR" or "Exclusive NOR" logic function;

the modulation input of each respective duplicate of the circuit is connected to the output of the respective additional logic element;

inputs of the respective additional logic element are connected: (a) to the output of the third logic element of the previous duplicate of the circuit, and (b) to the output of the third logic element of the subsequent duplicate of the circuit; and the output of the D-trigger of each respective duplicate of the circuit is adapted for connection to an external circuit for further processing or consumption of random numbers.

* * * * *